United States Patent
Lazic et al.

(10) Patent No.: US 10,446,366 B1
(45) Date of Patent: Oct. 15, 2019

(54) IMAGING TECHNIQUE IN SCANNING TRANSMISSION CHARGED PARTICLE MICROSCOPY

(71) Applicant: FEI Company, Hillsboro, OR (US)

(72) Inventors: Ivan Lazic, Eindhoven (NL); Eric Gerardus Theodoor Bosch, Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 15/895,076

(22) Filed: Feb. 13, 2018

(51) Int. Cl.
*H01J 37/26* (2006.01)
*H01J 37/28* (2006.01)
*H01J 37/22* (2006.01)
*H01J 37/20* (2006.01)
*H01J 37/244* (2006.01)

(52) U.S. Cl.
CPC ............ *H01J 37/265* (2013.01); *H01J 37/20* (2013.01); *H01J 37/222* (2013.01); *H01J 37/244* (2013.01); *H01J 37/28* (2013.01); *H01J 2237/2007* (2013.01); *H01J 2237/221* (2013.01); *H01J 2237/2446* (2013.01); *H01J 2237/2802* (2013.01); *H01J 2237/2806* (2013.01)

(58) Field of Classification Search
CPC ........ H01J 37/20; H01J 37/222; H01J 37/244; H01J 37/265; H01J 37/28; H01J 2237/2007; H01J 2237/221; H01J 2237/2446; H01J 2237/2802; H01J 2237/2806; G21K 5/02; G21K 1/08
See application file for complete search history.

(56) References Cited

U.S. PATENT DOCUMENTS 9,312,098 B2 * 4/2016 Lazic ................... H01J 37/244
2016/0307729 A1 * 10/2016 Lazic ................... H01J 37/222

* cited by examiner

*Primary Examiner* — David E Smith
(74) *Attorney, Agent, or Firm* — Denton W. McAlister (57) ABSTRACT

An example method of imaging a specimen in a Scanning Transmission Charged Particle Microscope may include scanning a beam of charged particles across a specimen, detecting, by a segmented detector, a flux of charged particles traversing through the specimen at each scan location, for each scan location, combining detection data from different segments of the detector to produce a respective vector output, forming, based on the respective vector output data for each scan location, an imaging vector field, forming, based on the imaging vector field, an integrated vector field image, and reducing error in either the imaging vector field prior to forming the integrated vector field image or correcting the integrated vector field image, wherein the error is due to pointwise variations in beam incidence angle on the specimen.

20 Claims, 5 Drawing Sheets

IMAGING TECHNIQUE IN SCANNING
TRANSMISSION CHARGED PARTICLE
MICROSCOPY

FIELD OF THE INVENTION

Generally disclosed herein are techniques for imaging using scanning transmission charged particle microscopy, and more specifically, techniques for reducing errors in integrated vector field imaging as implemented in scanning transmission charged particle microscopy.

BACKGROUND OF THE INVENTION

Imaging with charged particle microscopes comes in various flavors. For example, there is transmission electron microscopy (TEM), scanning electron microscopy (SEM), scanning transmission electron microscopy (STEM), to name a few. While these few examples typically use electrons for the charged particles, ions may also be used. The images are formed either due to electrons traversing through a sample, as with TEM and STEM, or by secondary electrons being emitted from a sample due to a primary electron beam, as with SEM. The images from TEM and STEM may be obtained using various mathematical transformations using a diffraction pattern, for example. These images, however, may include errors associated with the microscope. For example, incident angle of an electron beam may introduce geometric errors in certain transmission-based images, such as with integrated vector field (iVF) imaging. While previous attempts at correcting iVF imaging have been attempted, the outcomes have not provided the desired results. As such, a technique to reduce errors in iVF imaging is desired.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of a charged particle microscope, which may be a scanning transmission electron microscope for example. In some embodiments, pointwise errors/deviations due to incident angle of an impinging charged particle beam on a sample may be determined through processing for calibration, and then subtracted from images to correct the images for the errors/deviations. Additionally or alternatively, the cause of the errors may be addressed to remove/reduce the errors from the images. However, it should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example.

In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. It should be noted that, in addition to imaging and performing (localized) surface modification (e.g. milling, etching, deposition, etc.), a charged particle microscope may also have other functionalities, such as performing spectroscopy, examining diffractograms, studying ion channeling/ion backscattering (Rutherford Backscattering Spectrometry), etc.

In general, a Charged Particle Microscope (CPM) will comprise at least the following components a particle source, an illuminator, a specimen holder, and one or more detectors. The particle source, such as a tungsten or LaB6 source, can be a Schottky gun or Cold Field Emission Gun (CFEG) in the case of electrons, or a Liquid Metal Ion Source (LMIS) or Nano-Aperture Ion Source (NAIS) in the case of ions, for instance. The illuminator (illumination system; illuminating particle-optical column) serves to manipulate a "raw" radiation beam from the source and perform upon it certain operations such as focusing, aberration mitigation, cropping (with a diaphragm), filtering, etc. Additionally, the illuminator will generally include one or more (charged-particle) lenses, and may comprise other types of (particle-)optical component. If desired, the illuminator can be provided with a deflector system that can be invoked to cause its exit beam to perform a scanning motion across the specimen being investigated. The specimen holder provides a surface on which a specimen under investigation can be held and positioned (e.g. tilted, rotated). If desired, the holder can be moved so as to effect scanning motion of the specimen with respect to the beam, which may be coupled to a positioning system. When designed to hold cryogenic specimens, the specimen holder can comprise means for maintaining said specimen at cryogenic temperatures, e.g. using an appropriately connected cryogen vat. The one or more detectors (e.g., for detecting radiation emanating from an irradiated specimen) may be unitary or compound/distributed in nature, and can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations. In the context of the present disclosure, it may be desirable that the detector is segmented, e.g. as in the case of a quadrant detector, pixelated detector (camera sensor), Position Sensitive Detector (PSD), etc.

A Transmission Charged Particle Microscope (TCPM; such as a TEM, for example), will at least include an imaging system in addition to the components discussed above. The imaging system (e.g., an imaging particle-optical column) may receive charged particles that are transmitted through a specimen (plane) and directs (focuses) the charged particles onto an analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

The techniques disclosed herein, and which are disclosed by way of example, may be set forth in the specific context of electron microscopy; however, such simplification is intended solely for clarity/illustrative purposes, and should not be interpreted as limiting.

The imaging technique disclosed herein may generally be referred to as Integrated Vector Field (iVF) imaging. An example of iVF is described in U.S. Pat. No. 9,312,098 and US 2016/307729 A1, both of which have inventors in common with the present disclosure. While the previous iterations of iVF have provided quality results, the present disclosure provides improvements thereon. In particular, the present disclosure addresses a source of error that can occur in existing implementations of iVF imaging, which may be due to pointwise variations in beam incidence angle on a specimen. An example error correction technique may include correcting one or both of an imaging vector field prior to an integration operation, and/or correcting an integrated vector field image. Additionally or alternatively, a cause of such errors may be addressed by the present disclosure, where the errors may be associated with pivot point imperfections in a deflector system used to effect beam scanning upon a specimen, for example. The pivot point imperfections may result in adding an undesirable angle to the charged particle beam incident on the sample.

A potential issue with the known iVF technique can arise when relative scanning motion of the imaging beam and specimen is implemented via beam deflection (which is typically the case) as opposed to specimen displacement: as the beam moves from left to right and top to bottom (on the specimen footprint) during traversal of a scan trajectory, the incident angle (tilt) of the beam on the specimen can change (linearly) with position. The result is that the beam diffraction pattern—and hence the associated bright-field disk—moves relative to a reference center position of the segmented detector as a function of scanning position. This, in turn, affects the value of the vector output from the segmented detector for each scan position, thereby introducing pointwise errors into the imaging vector field. A linear positional dependency of errors in the imaging vector field becomes a quadratic positional dependency in the integrated vector field image—thereby exacerbating the effects of beam tilt variation when using iVF imaging.

The present disclosure may reduce or eliminate these effects by pre-correcting one or both of the imaging vector field, prior to said integration operation, and/or the iVF image itself so to mitigate/remove errors caused by said beam tilt variation (also called pivot point errors). The technique to reduce or eliminate the errors may be implemented in various embodiments as discussed herein.

One embodiment may at least include performing a reference imaging measurement (e.g., a null measurement) in which the beam does not traverse a specimen, so as to yield a reference vector field associated with pointwise variations in beam incidence angle, and effecting the correction step by using the reference vector field to correct the imaging vector field in a pointwise manner. This may be a thorough and accurate way of addressing variations in beam tilt, since the correction is performed on a point-by-point basis. This approach may be powerful because it makes a thorough, two-dimensional "map" of local beam tilt behavior across the imaging footprint of the beam, without needing to make any assumptions about a given specimen to be imaged and/or having to distill a global tendency by averaging out local properties. The reference/null measurement can be made in the complete absence of a specimen in the microscope, or simply by moving a holder-mounted specimen that may already be present out of the beam path. The coarseness (e.g., sampling point separation) of the reference imaging measurement to suit the needs of a given situation may be selected as desired.

Another embodiment of the technique may at least include assembling signals from different segments of the detector to form a gradient image, deriving an average intensity slope value across the gradient image, effecting the correction step by subtracting the average intensity slope value from the gradient image, and rendering said corrected gradient image as an imaging vector field (which will then be integrated to form an iVF image). This approach may ignore local behavior, and instead concentrates on a global tendency within the specimen, e.g., that beam tilt variation tends to produce a linear (intensity) slope in (gradient imagery associated with) the imaging vector field. This average slope can be measured, and then subtracted from the gradient image, before converting this back into a corrected imaging vector field. As set forth in more detail in the abovementioned U.S. Pat. No. 9,312,098, a gradient image can be assembled by considering (in complementary orthogonal directions, and for each sampling position) a difference-signal between different segments of the detector; this difference-signal can then be regarded as representing an intensity gradient. Another way of looking at this is that, in the imaging vector field, one considers—at each sampling position—the coordinate values (Vx, Vy) of the associated vector along each of said complementary orthogonal directions (X, Y), and regards these coordinate values as representing an intensity gradient. The gradient image is then a "map" of this intensity gradient as a function of position, and this gradient image will contain a global/average slope in a particular direction as a result of the underlying beam tilt errors. This slope can be measured/fitted, and then removed (essentially be adding its inverse to the gradient image).

Yet another embodiment of the present disclosed technique at least includes fitting a quadratic intensity curve to said integrated vector field image, and effecting the correction step by amending pointwise intensity values in the integrated vector field image according to an inverse of the intensity curve. Here, the correction is performed on the iVF image itself rather than on the precursor imaging vector field. Since integrating a linear function will produce a quadratic function, a slope in the precursor imaging vector field will result in a quadratic intensity variation (e.g. a paraboloid/hyperboloid) in the iVF image. A model quadratic function with variable parameters can be fit to the iVF image (which is a pointwise intensity map). Once a fit is determined (within pre-defined convergence criteria, for example), the parametrized function can be subtracted from the iVF image (for example, by adding its inverse).

A variant of the embodiment in the previous paragraph comprises performing a high-pass filtering operation on the iVF image. Such high-pass filtering can be used to "automatically"/"blindly" remove a quadratic intensity function present in the image, without first determining the parameters of the function in question. This approach, however, can cause some artifacts in the iVF image—particularly near its edges—but it is relatively quick and easy to perform.

The embodiments discussed above have been aimed at correcting the effects (in imagery) of beam tilt errors. Another aspect of the present disclosure addresses the cause of such errors—which, as set forth above, are typically associated with pivot point imperfections in a deflector system used to effect beam scanning upon the specimen. The technique to address the cause of such errors may at least include analyzing images, quantifying the error, and then adjusting the deflector system based on the determined error. For example, the technique at least includes analyzing one of the imaging vector field, prior to the integration operation and/or the integrated vector field image so to quantify an imaging error associated with pointwise variations in beam incidence angle on the specimen plane, and using the imaging error to adjust an (electrical) excitation value supplied to the deflector system, so as to reduce or eliminate the pointwise variations. Note that analyzing the imaging vector field in this context can encompass analyzing a gradient image derived therefrom, if so desired (see above). A relationship between the imaging error and a required adjustment to the excitation can be (pre-)determined using at least one of a series of calibration measurement and a mathematical simulation. Using a lookup table, for example, a controller/processor running the microscope can translate a given value of the determined imaging error into a corresponding ideal adjustment to the excitation.

Further, the techniques disclosed herein may be used in combination. For example, both the cause of the errors may be addressed and then the effect of any residual pivot point errors may be addressed.

Figure 1:
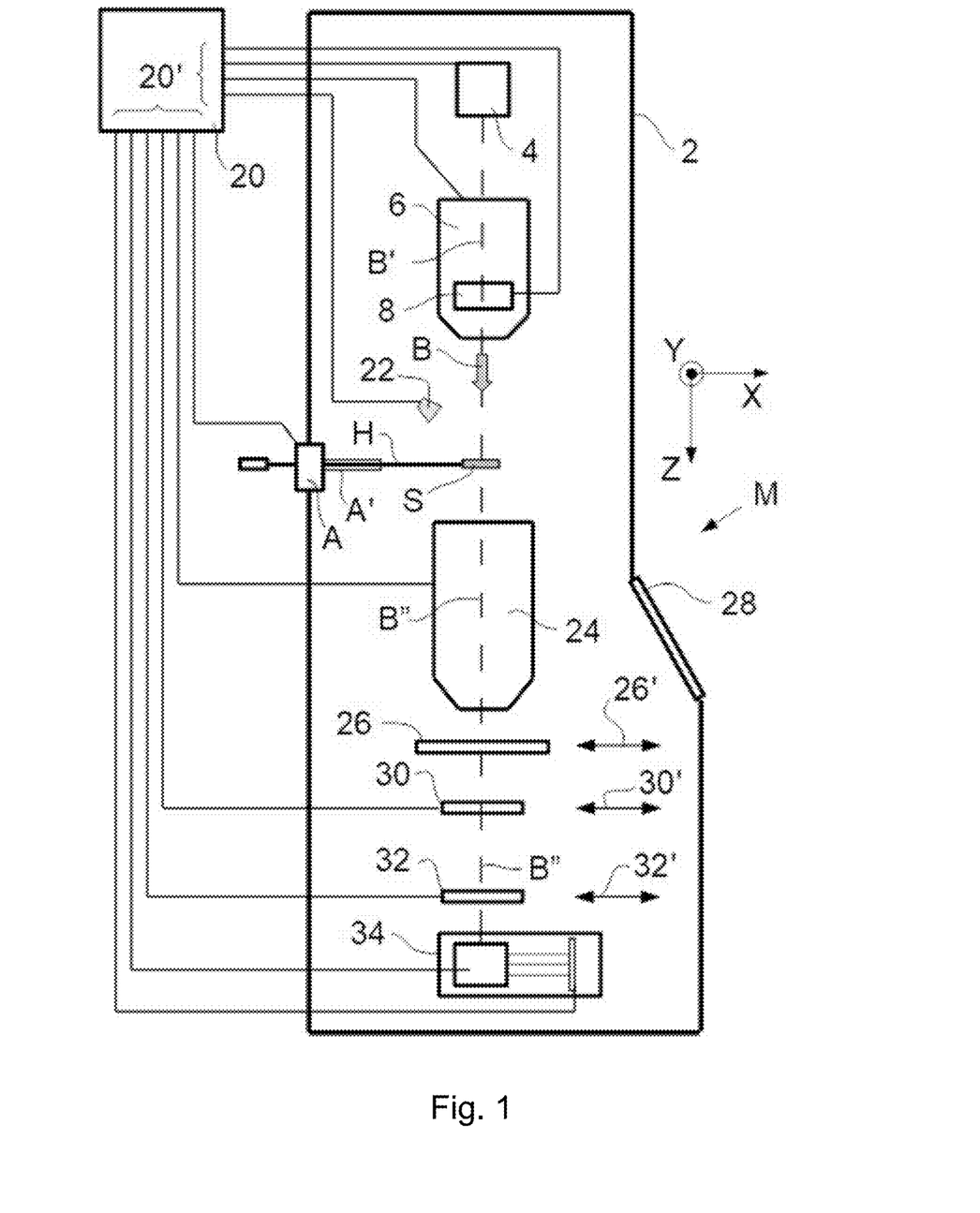
FIG. 1 illustrates a longitudinal cross-sectional view of an embodiment of an STCPM in accordance with an embodiment of the present disclosure.

FIG. 1 is a highly schematic depiction of an embodiment of a Scanning Transmission Charged Particle Microscope (STCPM) M in accordance with an embodiment of the present disclosure. Specifically, FIG. 1 shows an example STEM (though, in the context of the current invention, it could just as validly be an ion-based microscope, for example). In FIG. 1, within a vacuum enclosure 2, an electron source 4 produces a beam B of electrons that propagates along an electron-optical axis B" and traverses an electron-optical illuminator 6, serving to direct/focus the electrons onto a chosen part of a specimen S (which may, for example, be (locally) thinned/planarized). Also shown is a deflector system 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed. For example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B" (in the Z direction), and/or allows scanning motion to be performed, as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of an analysis device 22, which might be a combined scintillator/photomultiplier or EDX (Energy-Dispersive X-Ray Spectroscopy) module, for instance. In some embodiments, an image could be constructed using the same principle as in an SEM. However, alternatively/supplementally, one can study electrons that traverse (pass through) the specimen S, exit/emanate from it and continue to propagate (substantially, though generally with some deflection/scattering) along axis B". Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B". An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g., of the order of 1 meter). Consequently, various other types of detector/analysis apparatus can be used downstream of screen 26, such as TEM camera 30, STEM camera/detector 32, and spectroscopic apparatus 34. At TEM camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B". An output from STEM camera/detector 32 can be recorded as a function of (X, Y) scanning position of the beam B on the specimen S, and an image can be constructed that is a "map" of output from camera 32 as a function of X and Y. Camera 32 can comprise a single pixel with a diameter of around 20 mm, for example, as opposed to the matrix of pixels characteristically present in camera 30. Moreover, camera 32 will generally have a much higher acquisition rate (e.g., 106 points per second) than camera 30 (e.g., 102 images per second). Once again, when not required, camera 32 can be retracted/withdrawn (as schematically indicated by arrows 32') so as to get it out of the way of axis B" (although such retraction would not be a necessity in the case of a donut-shaped annular dark field camera 32, for example; in such a camera, a central hole would allow flux passage when the camera was not in use). As an alternative to imaging using cameras 30 or 32, the spectroscopic apparatus 34, which could be an EELS module, for example, may be included in system M. It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing set points, processing signals, performing calculations, and displaying messages/information on a display device (not depicted). The (schematically depicted) controller 20 may be (partially) inside or outside the enclosure 2, and may have a unitary or composite structure, as desired.

In some embodiments, the interior of the enclosure 2 does not have to be kept at a strict vacuum. For example, in a so-called "Environmental TEM/STEM", a background atmosphere of a given gas is deliberately introduced/maintained within the enclosure 2. In some embodiments, it may be advantageous to confine the volume of enclosure 2 so that, where possible, it essentially hugs the axis B", taking the form of a small tube (e.g., of the order of 1 cm in diameter) through which the employed electron beam passes, but widening out to accommodate structures such as the source 4, specimen holder H, screen 26, camera 30, camera 32, spectroscopic apparatus 34, etc.

With regards to the iVF techniques disclosed herein, the detector 32 may be embodied as a segmented detector, which, for example, may comprise a quadrant sensor, pixelated CMOS/CCD/SSPM detector, or PSD, for instance. Specific embodiments of such detectors are schematically shown in plan view in FIGS. 2A and 2B, and will be discussed in more detail below.

Figure 2A:
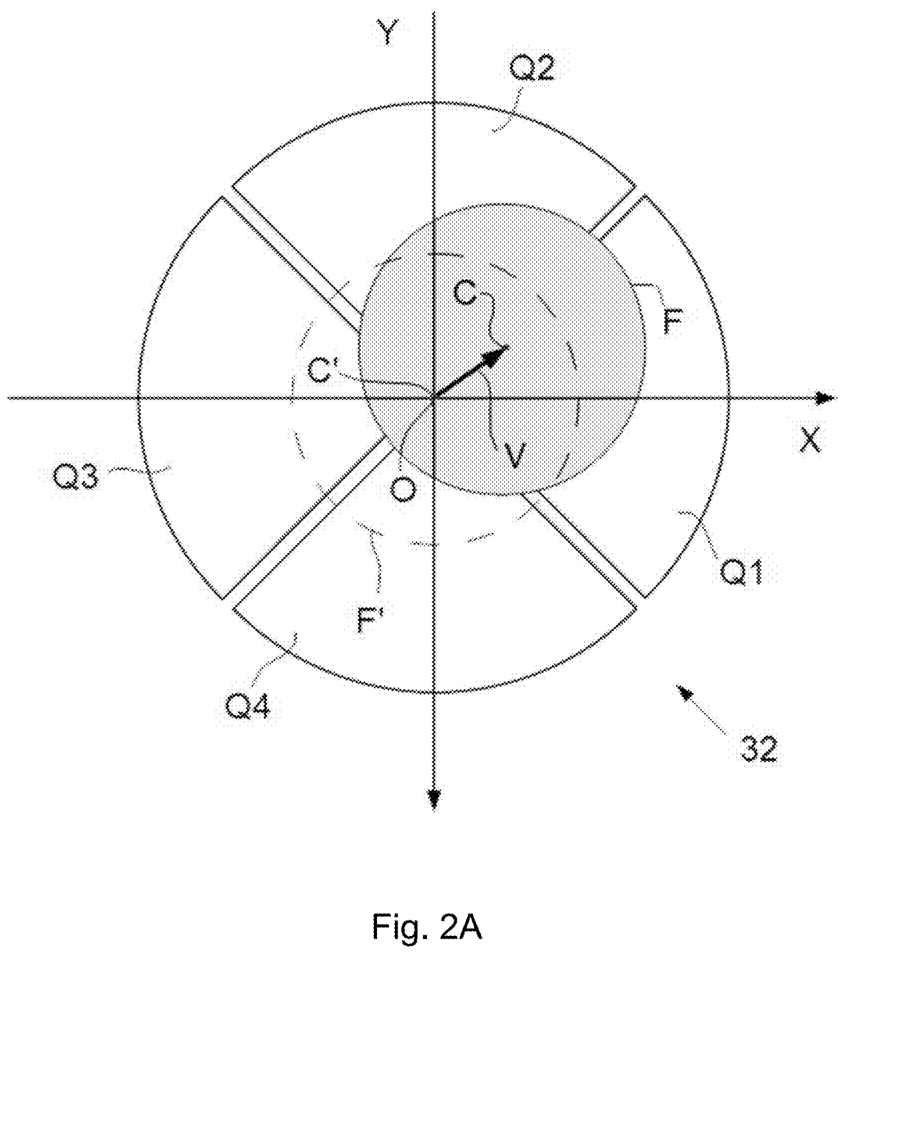
FIG. 2A is a plan view of a segmented detector in accordance with an embodiment of the present disclosure.
Figure 2B:
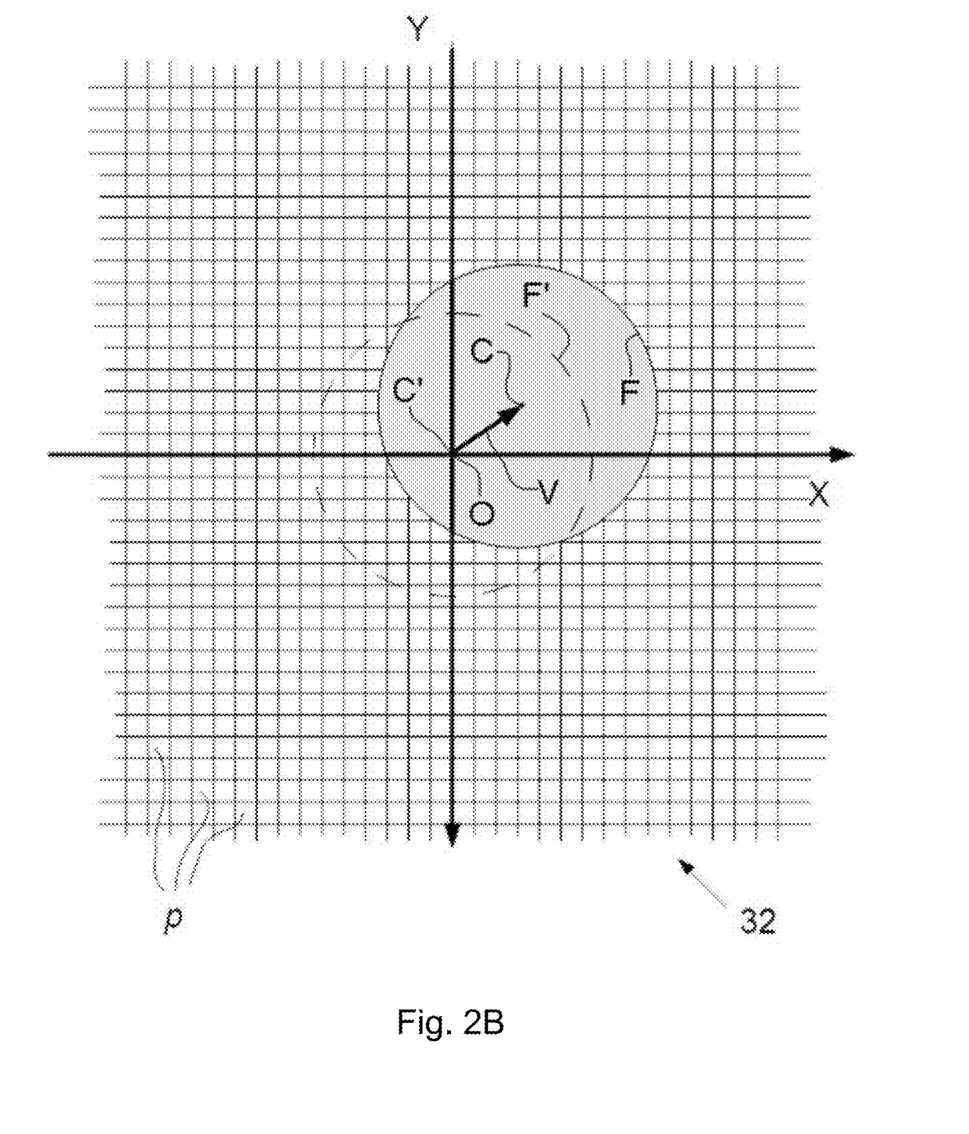
FIG. 2B is a plan view of another segmented detector in accordance with an embodiment of the present disclosure.

In operation, if a beam B propagating along particle-optical axis B" traverses the specimen S without undergoing any scattering/deflection in the specimen, then it will impinge (substantially) symmetrically on the center/origin O of the detector 32, and give a "null" reading. This situation is shown in more detail in FIGS. 2A and 2B, which show Cartesian axes X, Y with an origin at point O, on which is centered a dashed circle that schematically represents an impingement footprint F' of a (ghost) charged-particle beam B with barycenter C', e.g., the null reading. In FIG. 2A, the footprint F' is symmetrically overlaid on detection quadrants (electrodes) Q1, Q2, Q3, Q4. If the detection signals (electrical currents) from these quadrants are respectively denoted by S1, S2, S3, S4, then this situation will yield zero difference signals S1-S3 and S2-S4 between opposing pairs of quadrants. In FIG. 2B, which depicts an orthogonal matrix of detection pixels p (e.g., in a CMOS detector, possibly with an overlaid scintillation layer), there is zero deviation between the elected origin O of said pixel matrix and barycenter C'.

If, on the other hand, charged-particle beam B undergoes some scattering/deflection in the specimen S, it will land on the detector 32 at a position displaced from the origin O. In this context, FIGS. 2A and 2B show a beam footprint F with barycenter C that is no longer centered on O. The position of point C with respect to O defines a vector V, with an associated magnitude (length) and direction (pointing angle with respect to X axis, for example). This vector V can be expressed in terms of the coordinates (XC, YC) of point C, which can be distilled as follows $$X_C \sim \frac{S1 - S3}{S1 + S2 + S3 + S4} \quad (1)$$
$$Y_C \sim \frac{S2 - S4}{S1 + S2 + S3 + S4}.$$

The term in the denominator can be replaced by the total charged particle dose at every pixel position. However, when absorption effects in the specimen are relatively insignificant (as for thin specimens, for example), this total dose may be the same as the denominator in equation (1) [or proportional to it, in the case of absorption that does not significantly vary on a pointwise basis].

In FIG. 2B, one can derive values for XC, YC by examining output signals from the various pixels p, because pixels p that are impinged upon by the beam footprint F will give a different output signal (electrical resistance, voltage or current, for example) to pixels p outside the footprint F. The location of C can then be directly deduced by noting the coordinates of that particular pixel that yields an external signal, or indirectly determined by mathematically calculating the barycenter of the cluster of pixels p impinged on by B, or via a hybrid technique that combines both approaches, for example.

As beam B is scanned across the specimen S so as to trace out a two-dimensional scan path (area), the approach set forth in the previous item can be used to obtain a value of V for each coordinate position along said scan path. This allows compilation of a "map" of vector V as a function of scan position on the specimen S, which amounts to a mathematical field (and also a physical field, in that the vector V can be assigned a (proportional) physical meaning, such as electrostatic field vector). The vector field resulting from the previous step can then be integrated two-dimensionally, so as to obtain an integrated vector field (iVF) image (which represents a map of electrostatic potential in specimen S). It should be understood that size of beam footprint F can be altered by adjusting the so-called "camera length" of the STCPM of FIG. 1, for example.

Figure 3:
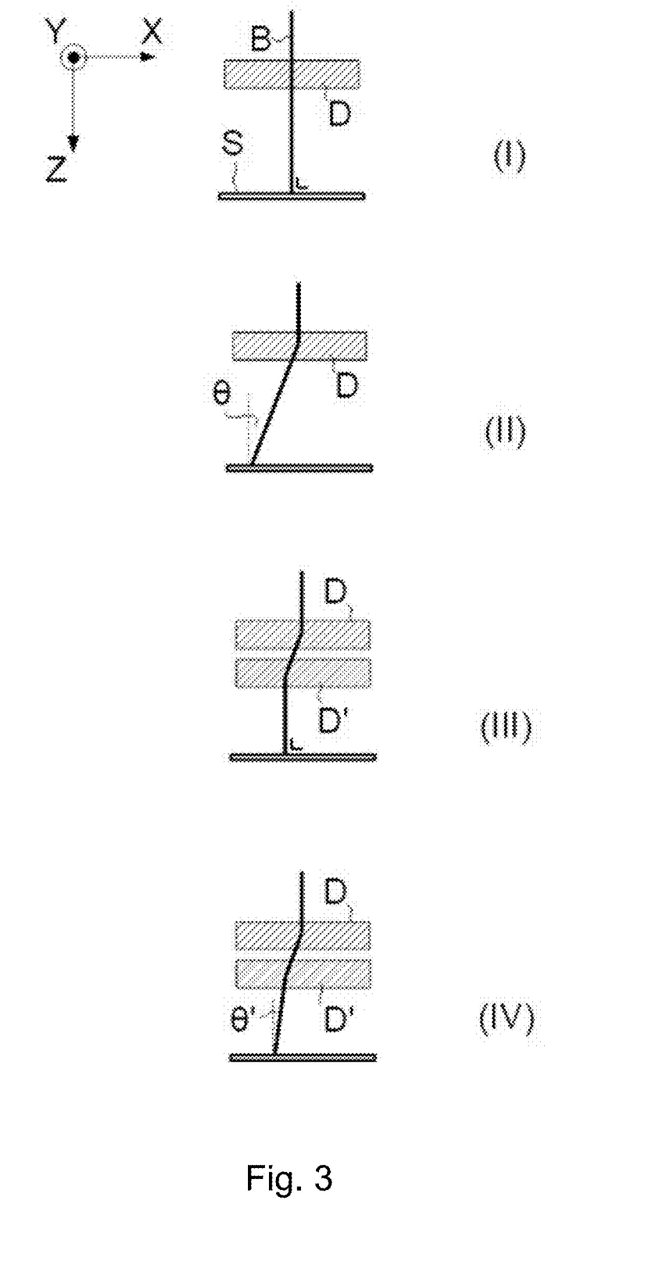
FIG. 3 illustrates the phenomenon of beam tilt error/pivot point error.

Turning now to FIG. 3, which illustrates the phenomenon of beam tilt error/pivot point error, in four sub-Figures. In all cases, a charged particle beam B impinges upon a specimen S, and a deflector D is used to cause deflection of the beam B in the XY plane of the depicted coordinate system.

In sub-Figure (I), beam B passes un-deflected through deflector D and makes normal (i.e., perpendicular) incidence upon specimen S.

In sub-Figure (II), deflector D has been excited so as to deflect beam B in the −X direction. As a result, the beam B impinges upon specimen S at a non-normal angle θ, whose value is a function of X (and/or Y). With reference to FIGS. 2A and 2B, it is evident that such non-normal incidence will cause a deflection error of the beam footprint F upon the detector 32 (which error is purely geometric in nature, rather than being associated with local properties of the specimen). Since θ is a function of X (and Y), this error will vary as a function of X (and Y). The effect of this error is to cause a slope (more generally, two slopes) in the imaging vector field compiled from the output of detector 32.

In sub-Figure (III), the situation in sub-Figure (II) has been corrected by adding a counterbalancing deflector D', which re-deflects beam B onto a normal-incidence path onto specimen S. For each desired beam position in X (and/or Y), the excitation of deflector D' matches that of D as regards amplitude, but is opposite in sign. Deflectors D and D' together form a deflector system 8.

In sub-Figure (IV), the effect is shown of an error (such as an alignment/pivoting error) in the set-up of sub-Figure (III). The result of this error is a residual non-normal incidence (at angle θ') of the beam B upon specimen S. This, in turn, will lead to a residual beam tilt error/pivot point error as discussed above.

With regards to the disclosed technique that addresses the effects of the error through correction of at least one of the (precursor) imaging vector field (prior to the subsequent integration operation), and (final) integrated vector field image, the error correction may be implemented in various ways.

A first implementation, labeled (a), a pointwise "calibration" measurement may be used. Implementation (a) at least includes performing a reference imaging measurement in which the beam B does not traverse a specimen S, so as to yield a reference vector field associated with pointwise variations in beam incidence angle θ', and effecting correction by using the reference vector field thus obtained to correct the imaging vector field in a point-by-point manner. The reference imaging measurement can be performed as a pre-calibration or post-calibration, as desired.

A second implementation, labeled (b), may include the measurement and removal of linear error in the imaging vector field. The linear error may manifest itself as an intensity slope (generally: two slopes) in a gradient image formed using a differential signal from complementary segments of the detector. Image analysis software may be used to detect such a slope, quantify it (e.g., using a linear equation), and then subtract it from the gradient image concerned. After correction, the gradient image can be converted back into a vector field (for each point, the intensity in an X-direction gradient image can be regarded as being the X component of an associated vector; similarly for Y), and integrated so as to obtain a corrected iVF image. One or more of these operations can be (automatically) enacted using processor 20, for example.

A third implementation, labeled (c), may include working directly with the iVF image instead of the imaging vector field, as discussed in (b). The third implementation may include fitting a quadratic intensity curve to the integrated vector field image, and effecting correction by amending pointwise intensity values in the iVF image according to an inverse of said intensity curve. This can be done using image analysis software, and one or more of the operations involved can be (automatically) enacted using processor 20, for instance.

Lastly, another implementation, labeled (d), may include performing a high-pass filtering operation on the iVF image. This option, however, may generally provide a less accurate "quick and simple" correction.

Regarding option (b) discussed above [e.g., the linear case], a linear slope in X-gradient and Y-gradient images can be respectively parameterized as:

$$z_x(x,y)=A_x \cdot x + B_x \cdot y + C_x$$

$$z_y(x,y)=A_y \cdot x + B_y \cdot y + C_y$$

where Ax, Ay, Bx, By, Cx and Cy are parameters that must be determined (e.g., fitted using linear regression). Note that, due to the way in which an iVF image is computed, the "DC" offsets (Cx and Cy) will be removed implicitly, and their values will therefore not play a part here. Once the other parameters—Ax, Ay, Bx, By—are determined, the two gradient images can be corrected by subtracting $z_x$ (x, y) from the X-gradient image and $z_y$ (x, y) from the Y-gradient image. The resulting, corrected gradient images can then be converted back into a vector field, and subsequently integrated to obtain a corrected iVF image.

With regard to option (c) discussed above [e.g., the quadratic case], the quadratic component of the iVF image can be written as:

$$z(x,y)=ax^2+by^2+cxy+dx+ey+f$$

where a, b, c, d, e and f are constants that must be determined (e.g., fitted using linear regression). Note that, due to the way in which an iVF image is computed, linear trends will be removed implicitly (i.e., d, e and f can all be set to zero), meaning that a global shift of the beam footprint (bright field disk) F would essentially go unnoticed (unless it is very large). By taking the derivative of z(x, y) in the x and y directions, one can identify the parameters a through c with those in the linear case above as follows:

$$A_x=2a$$

$$B_x=c$$

$A_y = c$ $B_y = 2b$

Once the parameters a through f are determined, the iVF image can be corrected by subtracting z(x, y) therefrom.

As regards option (a) discussed above [e.g., utilizing a calibration measurement], a linear regression analysis may be performed using a higher-order function (e.g., a higher order polynomial) for z(x, y) to find an optimal fit, which can then be subtracted from the iVF image obtained with the specimen present.

Figure 4A:
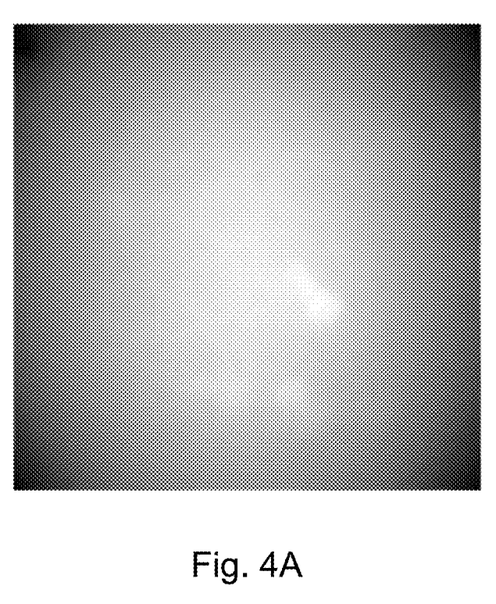
FIG. 4A shows an iVF image of a D3 bacteriophage virus, made without using the technique disclosed herein.
Figure 4B:
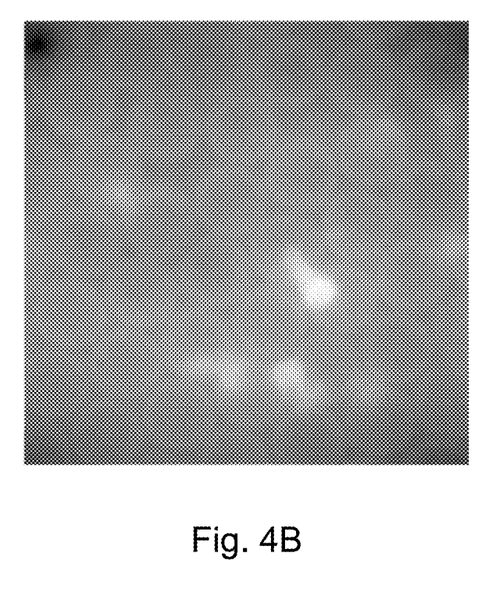
FIG. 4B corresponds to FIG. 4A, but is made using the technique disclosed herein.

To illustrate the effect of the present disclosure, some STEM imagery of a D3 bacteriophage virus is used in FIG. 4. FIG. 4A shows such imagery in which no correction has been made for beam tilt/pivot point errors, whereas FIG. 4B shows corresponding imagery after application of an embodiment disclosed herein. Specifically, an aspect correcting the effects of the errors, such a option (b) discussed above, was implemented to correct FIG. 4B. There is a very significant improvement shown in FIG. 4B. For example, the many (virus) globules that are clearly visible in FIG. 4B are substantially less well defined in FIG. 4A.

Rather than (or supplemental to) a correction such as that set forth above—which relate to correcting the effects of the error—correcting for the cause of the errors may also be implemented. For example, linear slope parameters—such as those obtained in section (i) of Embodiment 2—may be used to adjust the excitation of the deflectors D, D' in FIG. 3 (comprised in deflector system 8 in FIG. 1). For example, a set of calibration measurements, in which the excitations of deflectors D, D' are noted for various measured slope parameters may be used. Such an implementation may allow compilation of a lookup table and/or a calibration curve, from which a correctional excitation necessary to cancel out a measured slope (using interpolation/extrapolation, if necessary) may be derived. An alternative implementation may involve using exact physical parameters of the system (such as separation of deflectors D and D', a number of coil turns in D and D', a charged particle species, distance from deflector D' to specimen S, etc.) to calculate a correction that needs to be made to the excitations of D and D' so as to cancel out a given measured slope.

What is claimed is:

1. A method comprising:
   scanning a beam of charged particles across a specimen, wherein the scanning passes through a plurality of scan locations;
   detecting, by a segmented detector, a flux of charged particles traversing through the specimen at each scan location of the plurality of scan locations;
   for each scan location of the plurality of scan locations, combining detection data from different segments of the detector to produce a respective vector output;
   forming, based on the respective vector output data for each scan location, an imaging vector field;
   reducing error in the imaging vector field to form a corrected imaging vector field, wherein the error is due to pointwise variations in beam incidence angle on the specimen; and
   forming, based on the corrected imaging vector field, an integrated vector field image.

2. The method of claim 1, wherein reducing error in the imaging vector field to form a corrected imaging vector field includes:
   obtaining a reference vector field, wherein the reference vector field includes pointwise variations in beam incidence angle without the sample; and
   adjusting, based on the reference vector field, the imaging vector field.

3. The method of claim 2, wherein adjusting, based on the reference vector field, the imaging vector field includes subtracting the reference vector field from the imaging vector field.

4. The method of claim 2, wherein obtaining a reference vector field includes obtaining a two-dimensional map of beam tilt per scan location across an imaging footprint.

5. The method of claim 1, wherein reducing error in the imaging vector field to form a corrected imaging vector field includes:
   forming a gradient image from the imaging vector field;
   determining an intensity slope of the gradient image, wherein the intensity slope is based on linear error in the imaging vector field due to the pointwise variations in beam incidence angle on the specimen;
   removing the intensity slope from the gradient image to form a corrected gradient image; and
   converting the corrected gradient image to a corrected imaging vector field.

6. The method of claim 5, wherein the intensity slope is an average intensity slope based on an intensity slope associated with each scan position.

7. The method of claim 1, wherein forming an integrated vector field image includes performing a two-dimensional integration on the corrected vector field image.

8. The method of claim 1, wherein forming, based on the imaging vector field, an integrated vector field image includes performing a two-dimensional integration operation on the imaging vector field to form an integrated vector field image.

9. The method of claim 1, further comprising:
   determining an amount of pointwise variations in beam incidence angle on the specimen based on an imaging vector field or an integrated vector field image; and
   adjusting beam tilt control based on the determined amount of pointwise variations in beam incidence angle on the specimen.

10. A method comprising:
    scanning a beam of charged particles across a specimen, wherein the scanning passes through a plurality of scan locations;
    detecting, by a segmented detector, a flux of charged particles traversing through the specimen at each scan location of the plurality of scan locations;
    for each scan location of the plurality of scan locations, combining detection data from different segments of the detector to produce a respective vector output;
    forming, based on the respective vector output data for each scan location, an imaging vector field;
    forming, based on the imaging vector field, an integrated vector field image; and
    reducing error in the integrated vector field image to form a corrected integrated vector field image, wherein the error is due to pointwise variations in beam incidence angle on the specimen.

11. The method of claim 10, wherein reducing error in the integrated vector field image to form a corrected integrated vector field image includes:
    fitting a quadratic intensity curve to the integrated vector field image; and
    adjusting the integrated vector field image based on the quadratic intensity curve.

12. The method of claim 11, further comprising inverting the quadratic intensity curve.

13. The method of claim 12, wherein adjusting the integrated vector field image includes adjusting the integrated vector field image based on the inverted quadratic intensity curve.

14. The method of claim 10, wherein reducing error in the integrated vector field image to form a corrected integrated vector field image includes:
high-pass filtering the integrated vector field image.

15. The method of claim 10, further comprising:
determining an amount of pointwise variations in beam incidence angle on the specimen based on an imaging vector field or an integrated vector field image; and
adjusting beam tilt control based on the determined amount of pointwise variations in beam incidence angle on the specimen.

16. The method of claim 10, wherein, based on the segmented detector comprising four quadrants, for each scan location of the plurality of scan locations, combining detection data from different segments of the detector to produce a respective vector output includes:
calculating difference signals between complementary pairs of quadrants respectively arranged along mutually orthogonal directions to provide vector outputs for each scan location.

17. The method of claim 10, wherein, based on the segmented detector being a pixelated detector comprising an array of pixels, for each scan location of the plurality of scan locations, combining detection data from different segments of the detector to produce a respective vector output includes:
comparing pixel values to determine a location for a barycenter of the flux of charged particles on the segmented detector; and
expressing coordinate positions of said barycenter on the detector.

18. A system comprising:
a specimen holder, for holding a specimen in a specimen plane;
an illuminator, for directing a beam of charged particles from a source onto the specimen;
a segmented detector, for detecting a flux of charged particles traversing through the specimen; and
a controller including code, that when executed by the controller, causes the system to:
scan a beam of charged particles across a specimen, wherein the scanning passes through a plurality of scan locations;
detect, by the segmented detector, a flux of charged particles traversing through the specimen at each scan location of the plurality of scan locations;
for each scan location of the plurality of scan locations, combine detection data from different segments of the detector to produce a respective vector output;
form, based on the respective vector output data for each scan location, an imaging vector field;
form an integrated vector field image; and
provide a corrected integrated vector field image based either on a corrected imaging vector field or based on correcting the integrated vector field image, wherein the corrected integrated vector field image is corrected for error due to pointwise variations in beam incidence angle on the specimen.

19. The system of claim 18, wherein the controller includes code that, when executed by the controller, causes the system to correct the imaging vector field prior to forming the integrated vector field, the code either removing linear error from the imaging vector field based on a gradient image, or removing reference vector field information from the imaging vector field.

20. The system of claim 18, wherein the controller includes code that, when executed by the controller, causes the system to correct the integrated vector field image, the code either causing the integrated vector field image to be high-pass filtered, or subtracting a quadratic intensity curve from the integrated vector field image.

* * * * *